US005933545A

United States Patent [19]

Kazi et al.

[11] Patent Number: 5,933,545

[45] Date of Patent: Aug. 3, 1999

[54] DEVICE FOR THE DECIMATION OF DIGITAL DATA SEQUENCES

[75] Inventors: Farid Kazi, Grenoble; Alain Pirson, Moirans, both of France

[73] Assignee: Thomson multimedia S.A., Boulogne Cedex, France

[21] Appl. No.: 08/756,120

[22] Filed: Nov. 25, 1996

[30] Foreign Application Priority Data

Dec. 6, 1995 [FR] France .................................. 95 14430

[51] Int. Cl.[6] ...................................................... G06K 9/36

[52] U.S. Cl. .......................... 382/277; 382/264; 382/272; 382/300; 382/302; 348/581; 364/724.1; 364/724.13

[58] Field of Search ............................ 364/724.1, 724.13; 382/300, 272, 277, 298, 299, 264, 302; 348/580, 581, 568

[56] References Cited

U.S. PATENT DOCUMENTS

| | | | |
|---|---|---|---|
| 4,204,227 | 5/1980 | Gurley | 358/138 |
| 4,631,750 | 12/1986 | Gabriel et al. | 382/277 |
| 5,157,395 | 10/1992 | Del Signore et al. | 364/724.1 |
| 5,666,299 | 9/1997 | Adams et al. | 364/724.011 |

FOREIGN PATENT DOCUMENTS

| | | | |
|---|---|---|---|
| 0438782 | 7/1991 | European Pat. Off. | H04N 5/45 |
| WO91/19393 | 12/1991 | WIPO | H04N 7/12 |

OTHER PUBLICATIONS

Patent Abstracts of Japan vol. 017, No. 695 *E–1480) Dec. 20, 1993 & JP A 05 236345 (NEC IC Microcomput Syst LTD) Sep. 10, 1993.

Copy of Search Report.

*Primary Examiner*—Amelia Au

*Assistant Examiner*—Gilberto Frederick, II

*Attorney, Agent, or Firm*—Joseph S. Tripoli; Ronald H. Kurdyla

[57] ABSTRACT

A decimation device for digital data sequences includes a multiplexer mounted in cascade with a calculator producing, alternately, during a first calculation cycle, the mean $M_i$ of at least two data sequences representing the pixels P(i,j) and P(i,j+1) in a line $L_i$, and during a following calculation cycle, the mean $M_c$. The mean $M_c$ is composed of the mean $M_i$ and of an intermediate sequence previously calculated and stored in a storage register arranged between an output for the calculation stage and at least one of the inputs to the multiplexer. The intermediate sequence represents the mean $M_{i-1}$ of at least two data sequences representing pixels P(i−1,j) and P(i−1,j+1) in a line $L_{i-1}$, where i varies from 0 to N−1 and j varies from 0 to M-1.

8 Claims, 7 Drawing Sheets

DEVICE FOR THE DECIMATION OF DIGITAL DATA SEQUENCES

BACKGROUND OF THE INVENTION

The present invention relates to a device for the decimation of data sequences representing digital samples of a signal to be subsampled, the successive samples of which are represented by the successive matrix elements of a matrix with N rows and M columns.

Decimation is an operation which consists in reducing the size of a data block and relies on low-pass type filtering followed by sub-sampling.

The data block processed can be two-dimensional, such as a digital image containing N/2 even lines constituting an even frame and N/2 odd lines constituting an odd frame. In this case, decimation consists in reducing the size and resolution of the image processed. One of the most often used techniques consists in replacing a series of neighbouring points of the image by their mean. The decimation factor defines the mode of decimation and corresponds to the number of points averaged and replaced by a single point.

The devices used in the prior art to perform this operation generally include several calculation stages mounted in cascade, each stage periodically averaging the data which it receives from the preceding stage during a calculation cycle of at least one clock period.

Such devices require a large number of operators contributing to the rise in the cost of their manufacture.

Represented diagrammatically in FIG. 1 is a structure illustrating a decimation device of the prior art containing three stages 10, 12 and 14 mounted in cascade. Each of the three stages 10, 12 and 14 includes an adder 16 with two inputs 18 and 20, the input 18 receiving the data to be decimated while the input 20 receives the said data across a delay operator (22, 24, 26). The said adder 16 being connected via a sampling device 30, to the inputs 18 and 20 of the adder of the following stage.

Apart from the large number of operators which they contain, the decimation devices of this type do not allow optimum use of the various calculation stages. Indeed, the operations carried out by these devices are done sequentially over several successive calculation cycles in the course of which they produce alternately a useful result representing the mean, obtained in the course of a first calculation cycle, of a first sample P(i,j) and of a second sample P(i,j+1), and a non-useful result representing the mean, obtained in the course of the following calculation cycle, of the sample P(i,j+1) and of the sample P(i,j+2). Now, only the useful result is taken into account in the decimation operation. Such functioning is illustrated by FIG. 1*a*, representing for example sixteen pixels P(1,1) to P(1,16) situated in a line L, of a digital image. In this case, the decimation of the digital data representing the said pixels consists in replacing two adjacent pixels by a single pixel. For this purpose, the stage 10 of the device of FIG. 1 carries out in succession the calculation of the mean MP1 of the digital data representing the pixels P(1,1) and P(1,2), then that of the mean MP2 corresponding to the pixels P(1,2) and P(1,3), then that of the mean MP3 corresponding to the pixels P(1,3) and P(1,4), then that of the mean MP4 corresponding to the pixels P(1,4) and P(1,5), then that of the mean MP5 corresponding to the pixels P(1,5) and P(1,6) and so on up to the mean MP15 corresponding to the pixels P(1,15) and P(1,16). As may be observed, the stage 10 makes it possible to calculate fifteen different means MP1 to MP15 of which only the means bearing an odd index are useful, stated otherwise, the stage 10 produces only 50% of useful results in the course of a calculation cycle. Indeed, each of the means bearing an even index MP2, MP4, MP6 . . . MP14 involves the digital data corresponding to the pixel P(1,2), P(1,4), P(1,6) . . . P(1,14), which data are already used in the calculation of the means bearing an odd index MP1, MP3, MP5 . . . MP15 and which represent the useful results. The stage 12 then makes it possible to calculate the successive means of the digital data representing the pixels obtained by the calculation of the stage 10 and produces 50% of useful results on the basis of the previously calculated results, namely only 25% of useful results, obtained on the basis of the data received by the stage 10. Similarly, stage 14 will produce 50% of useful results on the basis of the 25% of the results received, namely 12.5% of useful results obtained on the basis of the data received by the stage 10.

SUMMARY OF THE INVENTION

The object of the invention is, on the one hand, to reduce the number of stages of the device and therefore the number of operators required to carry out the decimation and, on the other hand, to optimize the use of the calculation operators used.

According to the invention, the decimation device includes a multiplexing stage having a plurality of inputs mounted in cascade with a calculation stage capable of producing, alternately, during a first calculation cycle, the mean $M_i$ of at least two sequences representing the samples P(i,j) and P(i,j+1) situated in a line $L_i$, i varying from 0 to N−1 and; varying from 0 to M−1, and during the following calculation cycle, the mean Mc of the mean Mi obtained, and of an intermediate sequence previously calculated and stored in a storage means, the said intermediate sequence representing the mean $M_{i-1}$ of at least two samples P(i−1,j) and P(i−1,j+1) situated in the line $L_{i-1}$.

By virtue of the device according to the invention, the decimation operation is carried out with a reduced number of operators. Furthermore, the calculation cycles which produced non-useful results in the devices of the prior art are used to calculate a useful result. Indeed, the storing of the mean Mi−1 makes it possible to intercalate the calculation of the mean Mc between the successive calculations of the two means Mi−1 and Mi respectively representing at least two samples situated in the line Li−1, and at least two samples situated in the line Li.

According to another characteristic of the invention, the decimation device furthermore includes a control module delivering, on the one hand, to the calculation stage a signal k making it possible to select one mode from a plurality of possible decimation modes, and on the other hand, to the multiplexing stage, a signal m making it possible to route at least two sequences from among the sequences received to the calculation stage, correlatively with the decimation mode selected.

BRIEF DESCRIPTION OF THE DRAWINGS

Other characteristics and advantages of the invention will emerge from the description which follows, taken by way of non-limiting example, with references to the appended figures in which.

DESCRIPTION OF THE PREFERRED EMBODIMENTS

Figure 1:
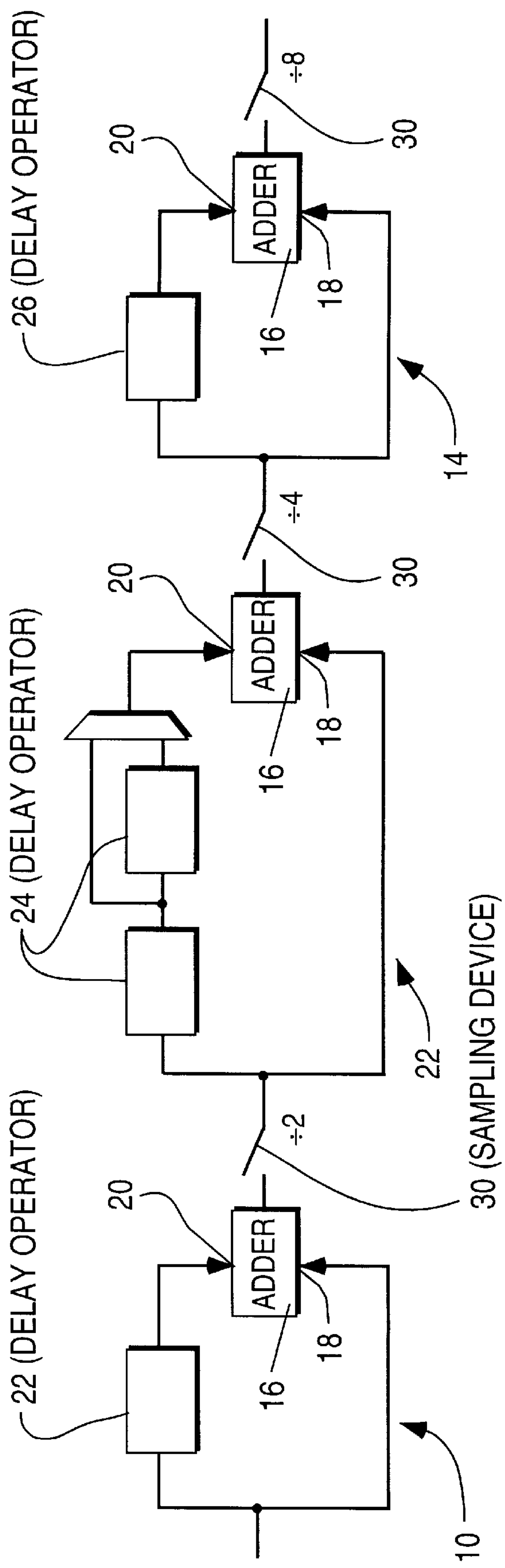
FIG. 1 represents diagrammatically a structure of a decimation device of the prior art.
Figure 1A:
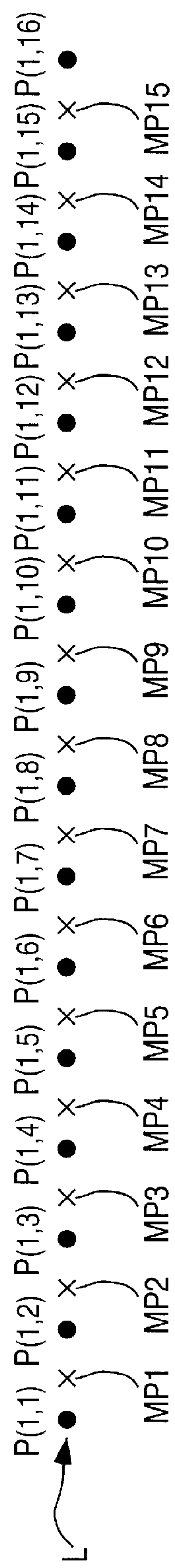
FIG. 1*a* illustrates diagrammatically a decimation of the data representing the pixels of a line of a digital image by means of the device of FIG. 1.
Figure 2:
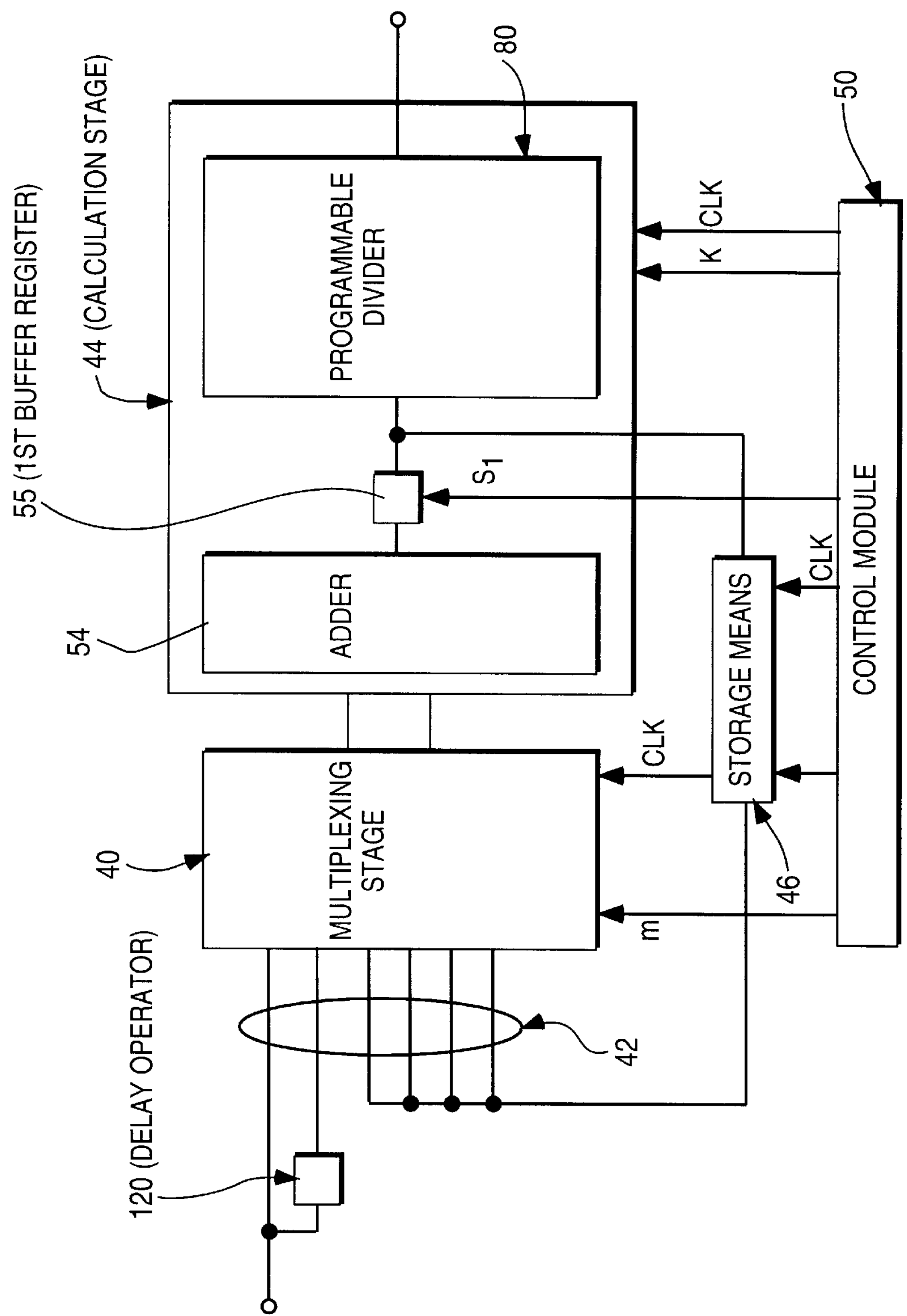
FIG. 2 represents a block diagram illustrating a decimation device according to the invention.

FIG. 2 represents a decimation device for data sequences representing values of the samples of a signal to be subsampled, each of the said subsamples being represented by a matrix element P(i,j) of a matrix with N rows and M columns. As may be seen in FIG. 2, the decimation device includes a multiplexing stage 40 having a plurality of inputs 42 mounted in cascade with a calculation stage 44 capable of producing, alternately, during a first calculation cycle, the mean $M_i$ of at least two sequences representing the samples P(i,j) and P(i,j+1) situated in a line $L_i$, i varying from 0 to N−1 and varying from 0 to M−1, and during the following calculation cycle, the mean Mc of the mean Mi obtained, and of an intermediate sequence previously calculated and stored in a storage means 46, the said intermediate sequence representing the mean Mi−1 of at least two samples P(i−1,j) and P(i−1,j+1) situated in the line $L_{i-1}$.

In a particular application of the invention, each matrix element P(i,j) represents the samples of a video signal sent to a pixel of a digital image of N rows and M columns.

The device represented in FIG. 2 furthermore includes a control module 50 delivering, on the one hand, to the calculation stage 44 a signal k making it possible to select one mode from a plurality of possible decimation modes, and on the other hand, to the multiplexing stage 40, a signal m making it possible to route at least two sequences from among the sequences received to the calculation stage 44, correlatively with the decimation mode selected.

Moreover, the calculation stage 44 includes an adder 54 connected via a first buffer register 55 to a programmable divider 80, the said divider 80 receiving from the control module 50 a signal representing a coefficient of division chosen correlatively with the mode of decimation selected, the said buffer register 55 receiving from the control module 50 a periodic signal s1 controlling the transfer to the storage means 46 of the sequences corresponding to useful results calculated by the adder 54.

Figure 3:
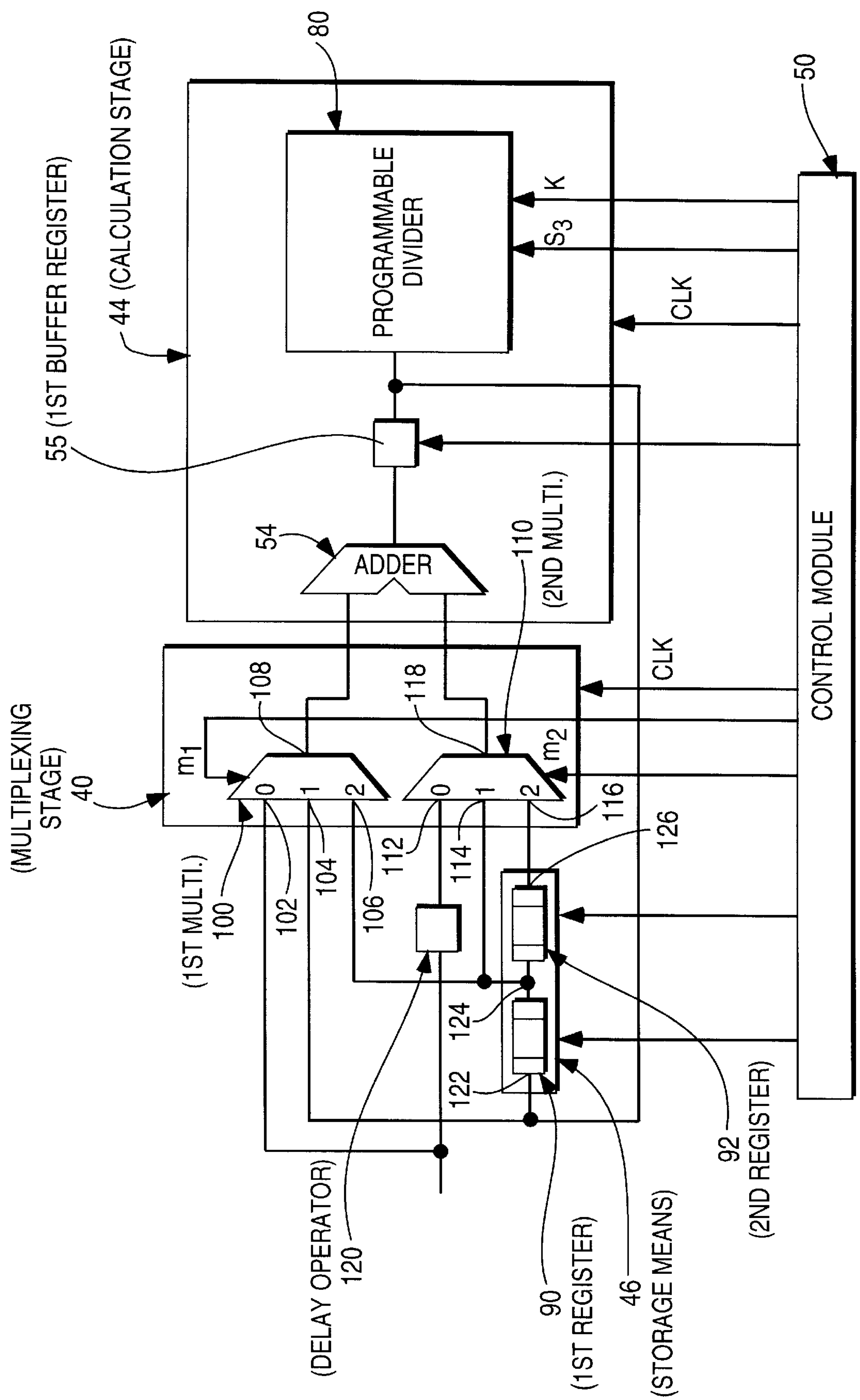
FIG. 3 represents a device according to a preferred embodiment of the invention.

According to a preferred embodiment of the invention represented in FIG. 3 and making it possible to decimate an image block of 8 lines and 8 columns, the storage means 46 is arranged between one output of the calculation stage (44) and one at least of the inputs of the multiplexing stage (40), and consists of a first register 90 associated with a second register 92, each of the said registers 90 and 92 being intended to store the digital samples corresponding to the video signals of at least four pixels of the processed image.

According to this embodiment, the multiplexing stage 40 includes two multiplexers, namely a first multiplexer 100 including three inputs 102, 104, 106 and an output 108, and receiving from the control module 50 a signal m1 for selecting one of the inputs 102, 104 or 106 and a second multiplexer 110 including three inputs 112, 114, 116 and an output 118, and receiving from the control module 50 a signal m2 for selecting one of the inputs 112, 114 or 116, the said multiplexers 100 and 110 are assembled in such a way that the input 102 receives a digital data sequence directly, that the input 112 is connected to the input 102 across a delay operator 120, that the input 104 is connected to a first terminal 122 of the register 90, that the inputs 106 and 114 are connected to a second terminal 124, common to the registers 90 and 92 and that the input 116 is connected to a third terminal 126 of the said register 92.

Figure 4:
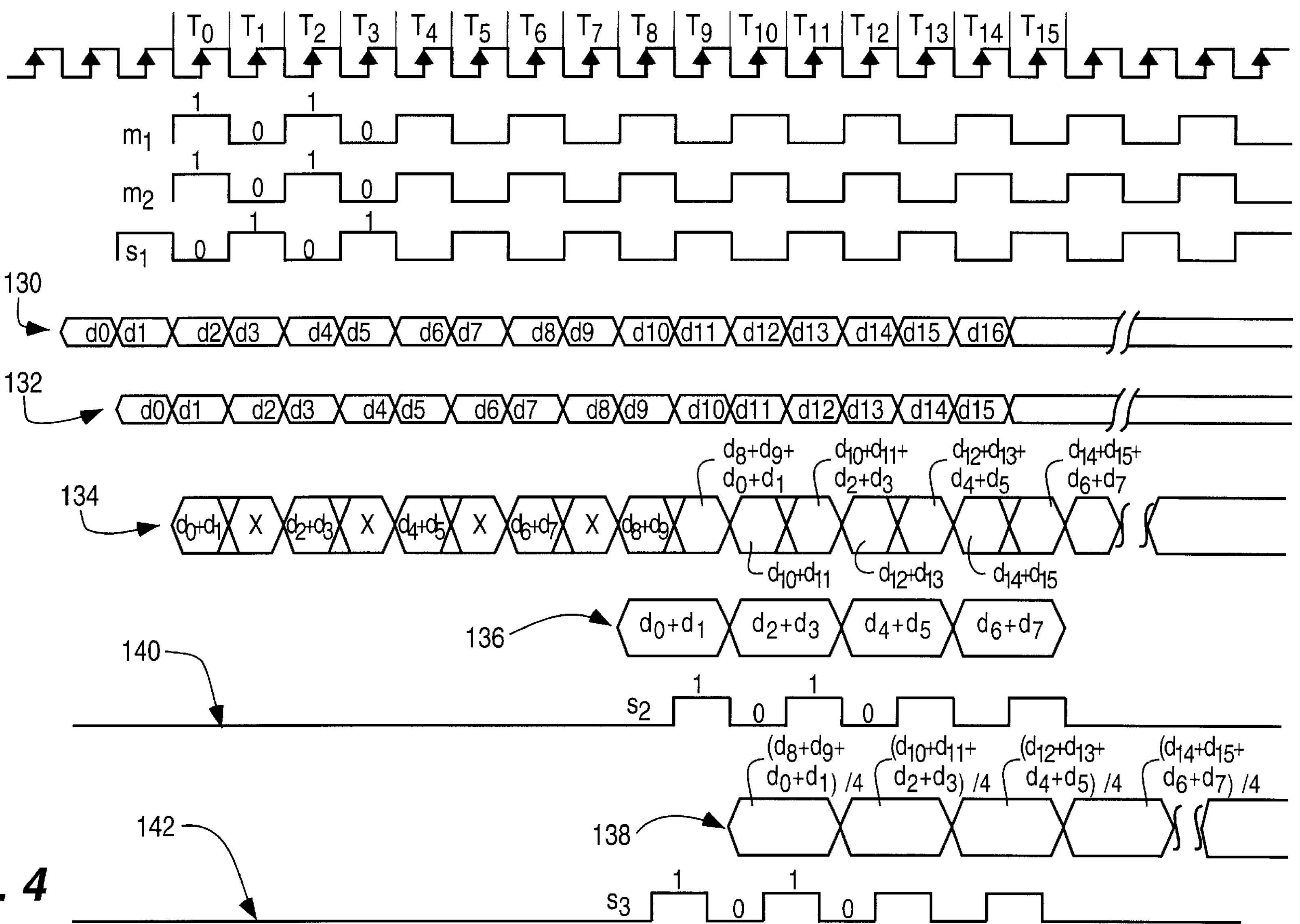
FIG. 4 represents timecharts illustrating an example of the use of the device of FIG. 3.

FIG. 4 illustrates the functioning in mode 4 of the device of FIG. 3 by timing diagrams representing the various signals delivered by the control module 50. The respective addresses of the inputs 102, 104, 106 (respectively of the inputs 112, 114, 116) are represented by the digits 0, 1 and 2. Thus, the selection on the multiplexer 100 (respectively on the multiplexer 110) of one of the inputs 102, 104, 106 (respectively 112, 114, 116) or respective addresses 0, 1 or 2 is achieved by giving m1 (respectively m2) one of the values 0, 1 or 2. In this example of the use of the decimation device, the control module 50 delivers to the various stages constituting the decimation device a synchronization signal CLK having a frequency of 27 MHz, and the signals m1 and m2 consist of two identical sequences whose levels vary periodically between a High state (1) a and Low state (0). The signal s1 is synchronized with the signals m1 and m2 and consists of a periodic sequence whose successive levels vary symmetrically with respect to the levels of the signals m1 and m2. Lines 130, 132, 134, 136 and 138 respectively represent the data applied to the input 102, the successive data contained in the second buffer register 120, the successive data gathered in the first buffer register 55, the successive data stored in the storage means 46 and the successive data gathered at the output of the divider 80.

Represented in line 130 are data d0 to d16 applied periodically to the input 102 whilst represented in line 132 are data applied, with a shift of one period, to the input 112. Represented in lines 140 and 142 are respectively a second signal s2 with two logic states and a signal s3 for validating the results obtained at the output of the divider 80.

Figure 5:
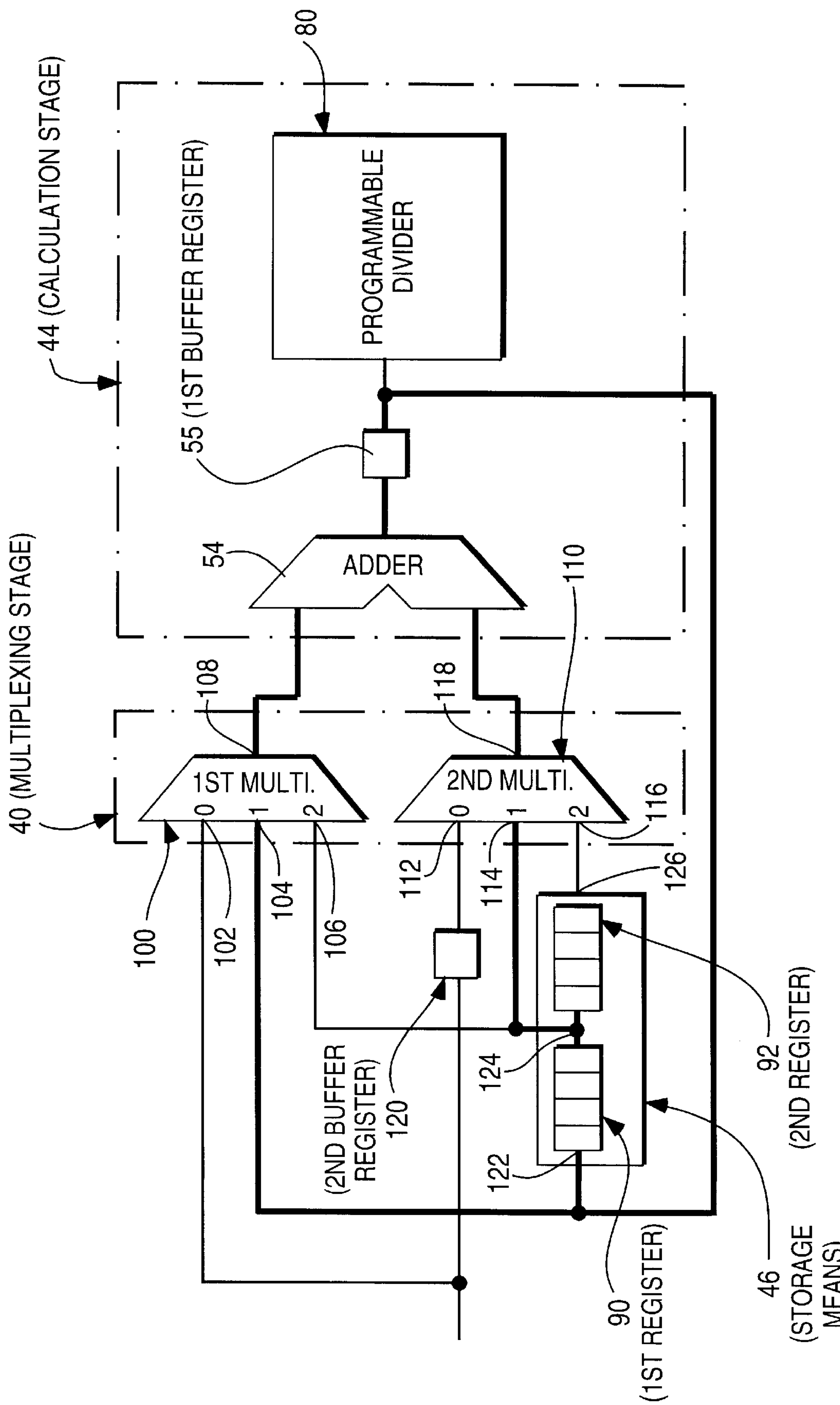
FIGS. 5 and 6 illustrate paths followed by the data processed in accordance with the example of use of FIG. 4.
Figure 6:
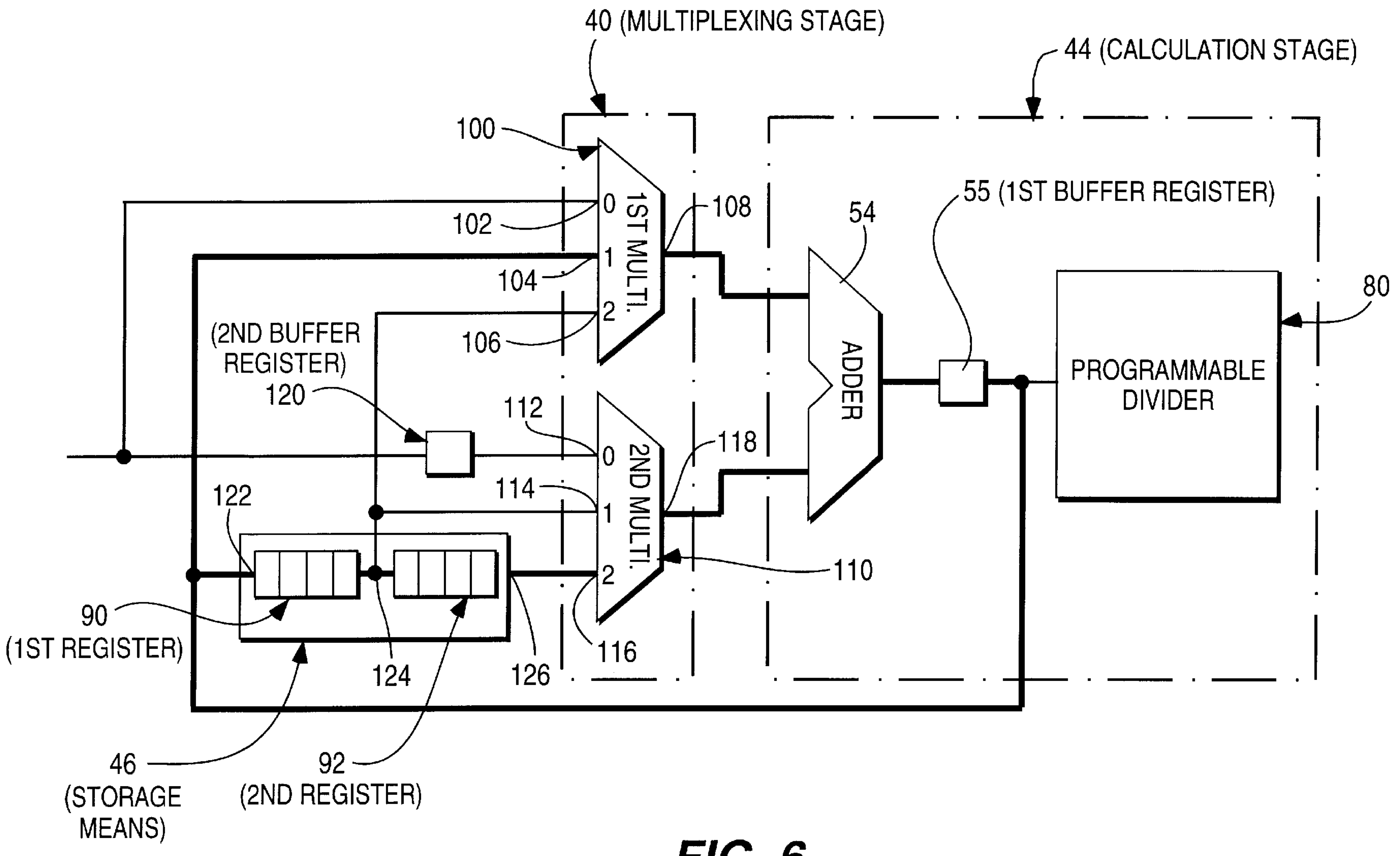

Represented in line 134 are the useful results obtained after the summations by the adder 54 of the data d0, d2, d4, d6, d8, d10, d12, d14 and d16 applied to the input 102 respectively with the data d1, d3, d5, d7, d9, d11, d13 and d15 applied to the input 112. These summations are performed for each combination of logic levels (m1=1, m2=1, s1=0) coinciding with the periods T0, T2, T4, T6, T8, T10, T12 and T14. These periods correspond to the calculation cycles producing useful results in this mode of decimation. The said calculation cycles produce, after a duration of eight periods, required for the scanning of a line of the processed image, the intermediate sequences d0+d1, d2+d3, d4+d5, d6+d7 which are stored in the storage mean 46. The combinations of logic levels (m1=0, m2=0, s1=1) coinciding with the periods T1, T3, T5, T7, T9, T11, T13 and T15 correspond to calculation cycles producing non-useful results symbolised by crosses in line 134. These results are not stored in the storage means 46 and the calculation cycles which produce them are used, starting from period T9, to calculate, at each combination of logic levels (m1=0, m2=0, s1=1), the sums (D1=d0+d1+d8+d9), (D2=d2+d3+d10+d11), (D3=d4+d5+d12+d13), (D4=d6+d7+d14+d15) of the sequences (d0+d1), (d2+d3), (d4+d5), (d6+d7) previously stored in the register 90 and of the useful results (d8+d9), (d10+d11), (d12+d13) and (d14+d15) calculated respectively during the periods T8, T10, T12 and T14. Note that the calculation of each sum D1, D2, D3 and D4 is performed during the periods which produced non-useful results in the devices of the prior art. Represented in bold in FIGS. 5 and 6 are the paths followed by the data routed by the multiplexing stage correlatively with the combinations of the logic levels of the signals m1, m2, s1 and s2. FIG. 5 represents a first path corresponding to the successive combinations (m1=m2=0, s1=1), whilst FIG. 6 represents a second path corresponding to the successive combinations (m1=m2=1, s1=0).

Of course, the combination of the signals m1, m2 and s1 can be readily modified by the control means in such a way as to effect another mode of decimation. These combinations may be adapted to enable sequences resulting from the scanning of two successive lines of the processed image to be stored jointly in the registers 90 and 92. In this case the averaging relates only to data sequences representing pixels belonging to the same frame. Moreover, the device can be used to decimate data representing any signal, previously sampled and whose samples constitute the successive sequences of a one-dimensional block. In this case N=1 and the storage means 46 consists of a single register.

We claim:

1. Device for the decimation of data sequences representing values of the samples of a signal to be subsampled, each of the said samples being represented by a matrix element P(i,j) of a matrix of N rows and M columns, comprising:

a multiplexing stage having a plurality of inputs each receiving a data sequence;

a calculation stage cascaded with said multiplexing stage; and a storage means; wherein said calculation stage produces, alternately, during a first calculation cycle, a mean $M_i$ of at least two sequences representing samples P(i,j) and P(i,j+1) situated in line $L_i$, i varying from 0 to N−1 and j varies from 0 to M−1, and during a following calculation cycle, a mean Mc of said mean Mi obtained and of an intermediate sequence previously calculated and stored in said storage means, said intermediate sequence representing a mean $M_{i-1}$ of at least two samples P(i−1,j) and P(i−1,j+1) situated in a line $L_{i-1}$.

2. The device according to claim 1, further comprising;

a control module delivering to said calculation stage a signal k for selecting one mode from a plurality of possible decimation modes, and to said multiplexing stage a signal m for routing at least two sequences from said sequences received to said calculation stage, correlatively with said decimation mode selected.

3. The device according to claim 2, wherein: said calculation stage includes an adder connected via a buffer register to a programmable divider, said divider receiving from said control module a signal representing a divisor chosen correlatively with said decimation mode selected, said buffer register receiving from said control module a periodic signal s1 controlling the transfer to said storage means of said sequences calculated by said adder.

4. The device according to claim 1, wherein each matrix element P(i,j) represents samples of a video signal sent to a pixel of a digital image of N lines and M columns.

5. The device according to claim 4, wherein:

said storage means includes a first register associated with a second register, each of said registers being intended to store said digital samples corresponding to said video signals of at least four pixels of a processed image.

6. The device according to claim 5, wherein:

said multiplexing stage includes a first multiplexer having inputs 1, 2 and 3 and an output, and receiving from said control module a signal m1 for selecting one of said inputs, and a second multiplexer having three inputs 4, 5 and 6 and an output, and receiving from said control means a signal m2 for selecting one of said inputs, said first and second multiplexers are assembled in such a way that said input 1 receives a digital data sequence directly, that said input 4 is connected to said input 1 across a delay operator, that said input 2 is connected to a first terminal of said first register, that said inputs 3 and 5 are connected to a second terminal, common to the said registers and that said input 6 is connected to a third terminal of said second register.

7. The device according to claim 1, wherein N=1.

8. The device according to claim 5, wherein said storage means is arranged between an output of said calculation stage and at least one input of said multiplexing stage.

* * * * *